(12) United States Patent
Yang (10) Patent No.: US 10,014,853 B1
(45) Date of Patent: Jul. 3, 2018

(54) DRIVING CIRCUIT OF A POWER CIRCUIT

(71) Applicant: Delta Electronics, Inc., Taoyuan (TW)

(72) Inventor: Chang-Jing Yang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 15/494,955

(22) Filed: Apr. 24, 2017

Related U.S. Application Data (63) Continuation-in-part of application No. 15/395,738, filed on Dec. 30, 2016.

(51) Int. Cl.
| | |
|---|---|
| *H03L 5/00* | (2006.01) |
| *H03K 17/16* | (2006.01) |
| *H02M 3/07* | (2006.01) |
| *H03K 3/3565* | (2006.01) |

(52) U.S. Cl.
CPC ............ *H03K 17/161* (2013.01); *H02M 3/07* (2013.01); *H03K 3/3565* (2013.01); *H03K 2217/0063* (2013.01); *H03K 2217/0072* (2013.01)

(58) Field of Classification Search
CPC .............. H03K 17/2871; H03K 3/3565; H01L 29/2003; H02M 3/07
USPC .......... 307/106, 109, 333; 326/61–62, 80–81
See application file for complete search history.

(56) References Cited

U.S. PATENT DOCUMENTS

| | | | | |
|---|---|---|---|---|
| 8,390,341 B2* | 3/2013 | Sugie | ................... | H03K 17/687 327/108 |
| 8,710,878 B2* | 4/2014 | Sugie | ................... | H03K 17/687 327/108 |
| 9,559,613 B2* | 1/2017 | Ejury | .................... | H02M 7/538 |
| 9,831,867 B1* | 11/2017 | Kinzer | ................. | H03K 17/687 |

* cited by examiner

*Primary Examiner* — Dinh T Le (74) *Attorney, Agent, or Firm* — Muncy, Geissler, Olds & Lowe, P.C.

(57) ABSTRACT

A power circuit includes a power transistor sinking a power current according to a voltage of a driving node and a driving circuit which includes a first bootstrap circuit, a second bootstrap circuit receiving a second internal signal to generate a first internal signal, a pre-driver receiving a third internal signal to generate the second internal signal, and a hysteresis circuit receiving a control signal to generate the third internal signal with a hysteresis. The first bootstrap circuit includes a high-side transistor providing a supply voltage to the driving node according to a high-side voltage, a low-side transistor electrically connecting the driving node to the ground according to the first internal signal, and a charge pump generating the high-side voltage exceeding the supply voltage according to the first internal signal and the second internal signal.

30 Claims, 8 Drawing Sheets

FIG. 8

DRIVING CIRCUIT OF A POWER CIRCUIT

CROSS REFERENCE TO RELATED APPLICATIONS

The present application is a continuation-in-part of and claims priority from U.S. patent application Ser. No. 15/395,738, filed Dec. 30, 2016, the content of which is hereby incorporated by reference in its entirety.

BACKGROUND OF THE INVENTION

Field of the Invention

The disclosure generally relates to a driving circuit integrated with a GaN power device.

Description of the Related Art

Figure 1:
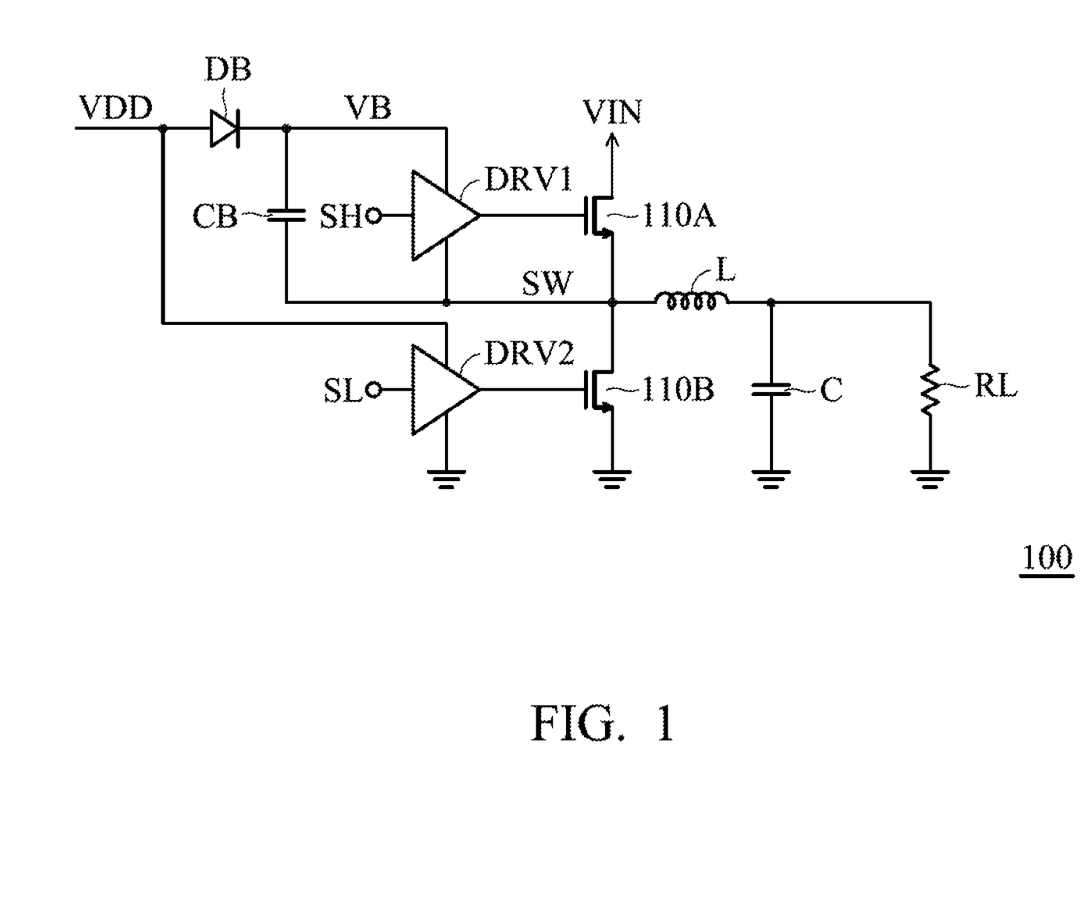
FIG. 1 illustrates a conventional power circuit.

In a power circuit, a charge pump is always required to boost the supply voltage to a higher voltage for driving the power transistor. FIG. 1 illustrates a conventional power circuit. As shown in FIG. 1, the high-side driver DRV1 is configured to drive the first power transistor 110A, and the low-side driver DRV2 is configured to drive the second power transistor 110B. In addition, the boost capacitor CB and the boost diode DB are configured to boost the supply voltage VDD to the boost voltage VB, such that the first power transistor 110A can be fully turned on. Therefore, the first power transistor 110A supplied by the input voltage VIN and the second power transistor 110B can drive the load device RL through the inductor L and the capacitor C.

Since the inductor L may induce significant parasitic effects at the switch node SW (such as a negative voltage spike generated at the switch node SW by the turned-on body diode of the second power transistor 110B), these parasitic effects can interfere with the boost voltage VB when the boost capacitor CB is charged through the power transistor. Therefore, it is necessary to eliminate parasitic effects from the driving circuit.

BRIEF SUMMARY OF THE INVENTION

In an embodiment, a power circuit comprises a power transistor and a driving circuit. The power transistor sinks a power current to a ground according to a driving voltage of a driving node. The driving circuit comprises a first bootstrap circuit, a second bootstrap circuit, a pre-driver, and a hysteresis circuit. The first bootstrap circuit comprises a high-side transistor, a low-side transistor, and a charge pump. The high-side transistor provides a supply voltage to the driving node according to a high-side voltage of a high-side node. The low-side transistor electrically connects the driving node to the ground according to a first internal signal. The charge pump is coupled to the high-side node and the driving node, which is configured to generate the high-side voltage that exceeds the supply voltage according to the first internal signal and a second internal signal. The second bootstrap circuit receives the second internal signal to generate the first internal signal at a first internal node. The pre-driver receives a third internal signal to generate the second internal signal at a second internal node. The second bootstrap circuit and the pre-driver are configured to improve the driving capability of the control signal. The hysteresis circuit receives a control signal to generate the third internal signal at a third internal node and is configured to provide a hysteresis for the control signal.

According to an embodiment of the invention, the high-side transistor and the low-side transistor are normally-off transistors.

According to an embodiment of the invention, the power transistor is a GaN transistor.

According to an embodiment of the invention, the charge pump comprises a first normally-on transistor, a feedback normally-off transistor, a first switch, a first normally-off transistor, a second normally-off transistor, a first capacitor, a third normally-off transistor, and a fourth normally-off transistor. The first normally-on transistor comprises a source terminal, a gate terminal, and a drain terminal, in which the source terminal and the gate terminal are coupled to a feedback node, and the drain terminal is supplied by the supply voltage. The feedback normally-off transistor comprises a source terminal, a gate terminal, and a drain terminal, in which the source terminal is coupled to the ground, the gate terminal is coupled to the driving node, and the drain terminal is coupled to the feedback node. The first switch is configured to electrically connect a first node to the ground according to the voltage of the feedback node. The first normally-off transistor comprises a source terminal, a gate terminal, and a drain terminal, in which the source terminal is coupled to the first node, the gate terminal is coupled to the high-side node, and the drain terminal is supplied by the supply voltage. The second normally-off transistor comprises a source terminal, a gate terminal, and a drain terminal, in which the source terminal is coupled to the ground, the gate terminal receives the first internal signal, and the drain terminal is coupled to the first node. The first capacitor is coupled between the first node and the high-side node. The third normally-off transistor comprises a source terminal, a gate terminal, and a drain terminal, in which the source terminal is coupled to the high-side node, the gate terminal receives the second internal signal, and the drain terminal is supplied by the supply voltage. The fourth normally-off transistor comprises a source terminal, a gate terminal, and a drain terminal, in which the source terminal is coupled to the ground, the gate terminal receives the first internal signal, and the drain terminal is coupled to the high-side node.

According to an embodiment of the invention, when the second internal signal is at a high voltage level, the first internal signal is at a low voltage level and the driving voltage is at the low voltage level, the voltage of the feedback node is raised by the first normally-on transistor to turn ON the first switch, so that the first capacitor is charged by the supply voltage through the third normally-off transistor and the first switch and the first node is charged by the first normally-off transistor. When the high-side voltage is raised to turn ON the first normally-off transistor, the voltage of the first node is raised to boost the high-side voltage for fully turning ON the high-side transistor. When the driving voltage is raised to turn ON the feedback normally-off transistor, the first switch is turned OFF, such that the voltage of the first node is raised to the supply voltage.

According to an embodiment of the invention, the second bootstrap circuit comprises a fifth normally-off transistor, a sixth normally-off transistor, a second capacitor, a first unidirectional conducting device, a first resistor, and a second switch. The fifth normally-off transistor comprises a source terminal, a gate terminal, and a drain terminal, in which the source terminal is coupled to the first internal node, the gate terminal is coupled to a second node, and the drain terminal is supplied by the supply voltage. The sixth normally-off transistor comprises a source terminal, a gate terminal, and a drain terminal, in which the source terminal is coupled to the ground, the gate terminal receives the second internal signal, and the drain terminal is coupled to the first internal node. The second capacitor is coupled between a third node and the first internal node. The first unidirectional conducting device unidirectionally provides the supply voltage to the third node. The first resistor is coupled between the second node and the third node. The second switch is configured to electrically connect the second node to the ground according to the second internal signal.

According to an embodiment of the invention, when the second internal signal is at a high voltage level, the sixth normally-off transistor and the second switch are turned ON and the second capacitor is charged by the supply voltage through the first unidirectional conducting device and the sixth normally-off transistor. When the second internal signal is at a low voltage level, the sixth normally-off transistor and the second switch are turned OFF, and the first resistor provides the voltage of the third node to the second node to turn ON the fifth normally-off transistor. When the fifth normally-off transistor is turned ON to raise the first internal signal, the voltage of the third node is equal to the sum of the voltage across the second capacitor and the first internal signal for fully turning ON the fifth transistor.

According to an embodiment of the invention, the second bootstrap circuit further comprises a second normally-on transistor. The second normally-on transistor comprises a source terminal, a gate terminal, and a drain terminal, in which the source terminal and the gate terminal are coupled to the first internal node and the drain terminal is supplied by the supply voltage. The second normally-on transistor is configured to improve the driving capability of the fifth normally-off transistor.

According to another embodiment of the invention, the second bootstrap circuit comprises a fifth normally-off transistor, a sixth normally-off transistor, a second unidirectional conducting device, a third capacitor, a discharge resistor, a third unidirectional conducting device, a fourth unidirectional conducting device, and a third switch. The fifth normally-off transistor comprises a source terminal, a gate terminal, and a drain terminal, in which the source terminal is coupled to the first internal node, the gate terminal is coupled to a second node, and the drain terminal is supplied by the supply voltage. The sixth normally-off transistor comprises a source terminal, a gate terminal, and a drain terminal, in which the source terminal is coupled to the ground, the gate terminal receives the second internal signal, and the drain terminal is coupled to the first internal node. The second unidirectional conducting device unidirectionally provides the supply voltage to a third node. The third capacitor is coupled between the third node and a charge node. The discharge resistor is coupled between the second node and the third node. The third unidirectional conducting device unidirectionally electrically connects the charge node to the second node when the voltage of the charge node exceeds the voltage of the second node. The fourth unidirectional conducting device unidirectionally provides the first internal signal to the charge node when the first internal signal exceeds the voltage of the charge node. The third switch receives the control signal and is configured to couple the high-side node to the ground according to the control signal.

According to an embodiment of the invention, each of the second unidirectional conducting device, the third unidirectional conducting device, and the fourth unidirectional conducting device is a diode or a diode-connected normally-off transistor.

According to an embodiment of the invention, when the second internal signal is at a high voltage level, the third switch is turned ON and the third capacitor is charged by the supply voltage through the second unidirectional conducting device, the third unidirectional conducting device, and the third switch. When the second internal signal is at a low voltage level, the third switch is turned OFF, the fourth unidirectional conducting device provides the first internal signal to the charge node, and the third capacitor is discharged to the second node through the discharge resistor.

According to an embodiment of the invention, the second bootstrap circuit further comprises a second normally-on transistor. The second normally-on transistor comprises a source terminal, a gate terminal, and a drain terminal, in which the source terminal and the gate terminal are coupled to the first internal node and the drain terminal is supplied by the supply voltage. The second normally-on transistor is configured to improve the driving capability of the fifth normally-off transistor.

According to an embodiment of the invention, the first bootstrap circuit further comprises a high-side normally-on transistor. The high-side normally-on transistor comprises a source terminal coupled to the driving node, a gate terminal coupled to the driving node, and a drain terminal supplied by the supply voltage. The high-side normally-on transistor is configured to improve the driving capability of the high-side transistor.

According to an embodiment of the invention, the pre-driver comprises a driving normally-on transistor and a seventh normally-off transistor. The driving normally-on transistor comprises a source terminal a gate terminal, and a drain terminal, in which the gate terminal and the source terminal are coupled to the second internal node and the drain terminal is supplied by the supply voltage. The seventh normally-off transistor comprises a source terminal, a gate terminal, and a drain terminal, in which the gate terminal receives the third internal signal, a source terminal is coupled to the ground, and the drain terminal is coupled to the second internal node.

According to an embodiment of the invention, the hysteresis circuit comprises a second resistor, an eighth normally-off transistor, a ninth normally-off transistor, a tenth normally-off transistor, and a third resistor. The second resistor is coupled between the supply voltage and the third internal node. The eighth normally-off transistor comprises a gate terminal coupled to a fourth node, a source terminal coupled to a fifth node, and a drain terminal coupled to the second resistor. The ninth normally-off transistor comprises a gate terminal coupled to the fourth node, a source terminal coupled to the ground, and a drain terminal coupled to the fifth node. The tenth normally-off transistor comprises a gate terminal coupled to the drain terminal of the eighth normally-off transistor, a source terminal coupled to the fifth node, and a drain terminal supplied by the supply voltage. The third resistor provides the control signal to the fourth node.

In an embodiment, a driving circuit for driving a power transistor which sinks a power current to a ground according to a driving voltage of a driving node comprises a first bootstrap circuit, a second bootstrap circuit, a pre-driver, and a hysteresis circuit. The first bootstrap circuit comprises a high-side transistor, a low-side transistor, and a charge pump. The high-side transistor provides supply voltage to the driving node according to the high-side voltage of a high-side node. The low-side transistor electrically connects the driving node to the ground according to a first internal signal. The charge pump is coupled to the high-side node and the driving node, which is configured to generate a high-side voltage that exceeds the supply voltage according to the first internal signal. The second bootstrap circuit receives the second internal signal to generate the first internal signal at a first internal node. The pre-driver receives a third internal signal to generate the second internal signal at a second internal node. The second bootstrap circuit and the pre-driver are configured to improve the driving capability of the control signal. The hysteresis circuit receives a control signal to generate the third internal signal and is configured to provide a hysteresis for the control signal.

According to an embodiment of the invention, the high-side transistor and the low-side transistor are normally-off transistors.

According to an embodiment of the invention, the power transistor is a GaN transistor.

According to an embodiment of the invention, the charge pump comprises a first normally-on transistor, a feedback normally-off transistor, a first switch, a first normally-off transistor, a second normally-off transistor, a first capacitor, a third normally-off transistor, and a fourth normally-off transistor. The first normally-on transistor comprises a source terminal, a gate terminal, and a drain terminal, in which the source terminal and the gate terminal are coupled to a feedback node, and the drain terminal is supplied by the supply voltage. The feedback normally-off transistor comprises a source terminal, a gate terminal, and a drain terminal, in which the source terminal is coupled to the ground, the gate terminal is coupled to the driving node, and the drain terminal is coupled to the feedback node. The first switch is configured to electrically connect a first node to the ground according to a voltage of the feedback node. The first normally-off transistor comprises a source terminal, a gate terminal, and a drain terminal, in which the source terminal is coupled to the first node, the gate terminal is coupled to the high-side node, and the drain terminal is supplied by the supply voltage. The second normally-off transistor comprises a source terminal, a gate terminal, and a drain terminal, in which the source terminal is coupled to the ground, the gate terminal receives the first internal signal, and the drain terminal is coupled to the first node. The first capacitor is coupled between the first node and the high-side node. The third normally-off transistor comprises a source terminal, a gate terminal, and a drain terminal, in which the source terminal is coupled to the high-side node, the gate terminal receives the second internal signal, and the drain terminal is supplied by the supply voltage. The fourth normally-off transistor comprises a source terminal, a gate terminal, and a drain terminal, in which the source terminal is coupled to the ground, the gate terminal receives the first internal signal, and the drain terminal is coupled to the high-side node.

According to an embodiment of the invention, when the second internal signal is at a high voltage level, the first internal signal is at a low voltage level, and the driving voltage is at the low voltage level, the voltage of the feedback node is raised by the first normally-on transistor to turn ON the first switch, so that the first capacitor is charged by the supply voltage through the third normally-off transistor and the first switch and the first node is charged by the first normally-off transistor. When the high-side voltage is raised to turn ON the first normally-off transistor, the voltage of the first node is raised to boost the high-side voltage for filly turning ON the high-side transistor. When the driving voltage is raised to turn ON the feedback normally-off transistor, the first switch is turned OFF, such that the voltage of the first node is raised to the supply voltage.

According to an embodiment of the invention, the second bootstrap circuit comprises a fifth normally-off transistor, a sixth normally-off transistor, a second capacitor, a first unidirectional conducting device, a first resistor, and a second switch. The fifth normally-off transistor comprises a source terminal, a gate terminal, and a drain terminal, in which the source terminal is coupled to the first internal node, the gate terminal is coupled to a second node, and the drain terminal is supplied by the supply voltage. The sixth normally-off transistor comprises a source terminal, a gate terminal, and a drain terminal, in which the source terminal is coupled to the ground, the gate terminal receives the second internal signal, and the drain terminal is coupled to the first internal node. The second capacitor is coupled between a third node and the first internal node. The first unidirectional conducting device unidirectionally provides the supply voltage to the third node. The first resistor is coupled between the second node and the third node. The second switch is configured to electrically connect the second node to the ground according to the second internal signal.

According to an embodiment of the invention, when the second internal signal is at a high voltage level, the sixth normally-off transistor and the second switch are turned ON and the second capacitor is charged by the supply voltage through the first unidirectional conducting device and the sixth normally-off transistor. When the second internal signal is at a low voltage level, the sixth normally-off transistor and the second switch are turned OFF, the first resistor provides a voltage of the third node to the second node to turn ON the fifth normally-off transistor. When the fifth normally-off transistor is turned ON to raise the first internal signal, the voltage of the third node is equal to the sum of the voltage across the second capacitor and the first internal signal for fully turning ON the fifth transistor.

According to an embodiment of the invention, the second bootstrap circuit further comprises a second normally-on transistor. The second normally-on transistor comprises a source terminal, a gate terminal, and a drain terminal, in which the source terminal and the gate terminal are coupled to the first internal node and the drain terminal is supplied by the supply voltage. The second normally-on transistor is configured to improve the driving capability of the fifth normally-off transistor.

According to another embodiment of the invention, the second bootstrap circuit comprises a fifth normally-off transistor, a sixth normally-off transistor, a second unidirectional conducting device, a third capacitor, a discharge resistor, a third unidirectional conducting device, a fourth unidirectional conducting device, and a third switch. The fifth normally-off transistor comprises a source terminal, a gate terminal, and a drain terminal, in which the source terminal is coupled to the first internal node, the gate terminal is coupled to a second node, and the drain terminal is supplied by the supply voltage. The sixth normally-off transistor comprises a source terminal, a gate terminal, and a drain terminal, in which the source terminal is coupled to the ground, the gate terminal receives the second internal signal, and the drain terminal is coupled to the first internal node. The second unidirectional conducting device unidirectionally provides the supply voltage to a third node. The third capacitor is coupled between the third node and a charge node. The discharge resistor is coupled between the second node and the third node. The third unidirectional conducting device unidirectionally electrically connects the charge node to the second node when a voltage of the charge node exceeds a voltage of the second node. The fourth unidirectional conducting device unidirectionally provides the first internal signal to the charge node when the first internal signal exceeds the voltage of the charge node. The third switch receives the control signal and is configured to couple the high-side node to the ground according to the control signal.

According to an embodiment of the invention, each of the second unidirectional conducting device, the third unidirectional conducting device, and the fourth unidirectional conducting device is a diode or a diode-connected normally-off transistor.

According to an embodiment of the invention, when the second internal signal is at a high voltage level, the third switch is turned ON and the third capacitor is charged by the supply voltage through the second unidirectional conducting device, the third unidirectional conducting device, and the third switch. When the second internal signal is at a low voltage level the third switch is turned OFF, the fourth unidirectional conducting device provides the first internal signal to the charge node, and the third capacitor is discharged to the second node through the discharge resistor.

According to an embodiment of the invention, the second bootstrap circuit further comprises a second normally-on transistor. The second normally-on transistor comprises a source terminal, a gate terminal, and a drain terminal, in which the source terminal and the gate terminal are coupled to the first internal node and the drain terminal is supplied by the supply voltage. The second normally-on transistor is configured to improve the driving capability of the fifth normally-off transistor.

According to an embodiment of the invention, the first bootstrap circuit further comprises a high-side normally-on transistor. The high-side normally-on transistor comprises a source terminal coupled to the driving node, a gate terminal coupled to the driving node, and a drain terminal supplied by the supply voltage. The high-side normally-on transistor is configured to improve the driving capability of the high-side transistor.

According to an embodiment of the invention, the pre-driver comprises a driving normally-on transistor and a seventh normally-off transistor. The driving normally-on transistor comprises a source terminal, a gate terminal, and a drain terminal, in which the gate terminal and the source terminal are coupled to the second internal node and the drain terminal is supplied by the supply voltage. The seventh normally-off transistor comprises a source terminal, a gate terminal, and a drain terminal, in which the gate terminal receives the third internal signal, a source terminal is coupled to the ground, and the drain terminal is coupled to the second internal node.

According to an embodiment of the invention, the hysteresis circuit comprises a second resistor, an eighth normally-off transistor, a ninth normally-off transistor, a tenth normally-off transistor, and a third resistor. The second resistor is coupled between the supply voltage and the third internal node. The eighth normally-off transistor comprises a gate terminal coupled to a fourth node, a source terminal coupled to a fifth node, and a drain terminal coupled to the second resistor. The ninth normally-off transistor comprises a gate terminal coupled to the fourth node, a source terminal coupled to the ground, and a drain terminal coupled to the fifth node. The tenth normally-off transistor comprises a gate terminal coupled to the drain terminal of the eighth normally-off transistor, a source terminal coupled to the fifth node, and a drain terminal supplied by the supply voltage. The third resistor provides the control signal to the fourth node.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
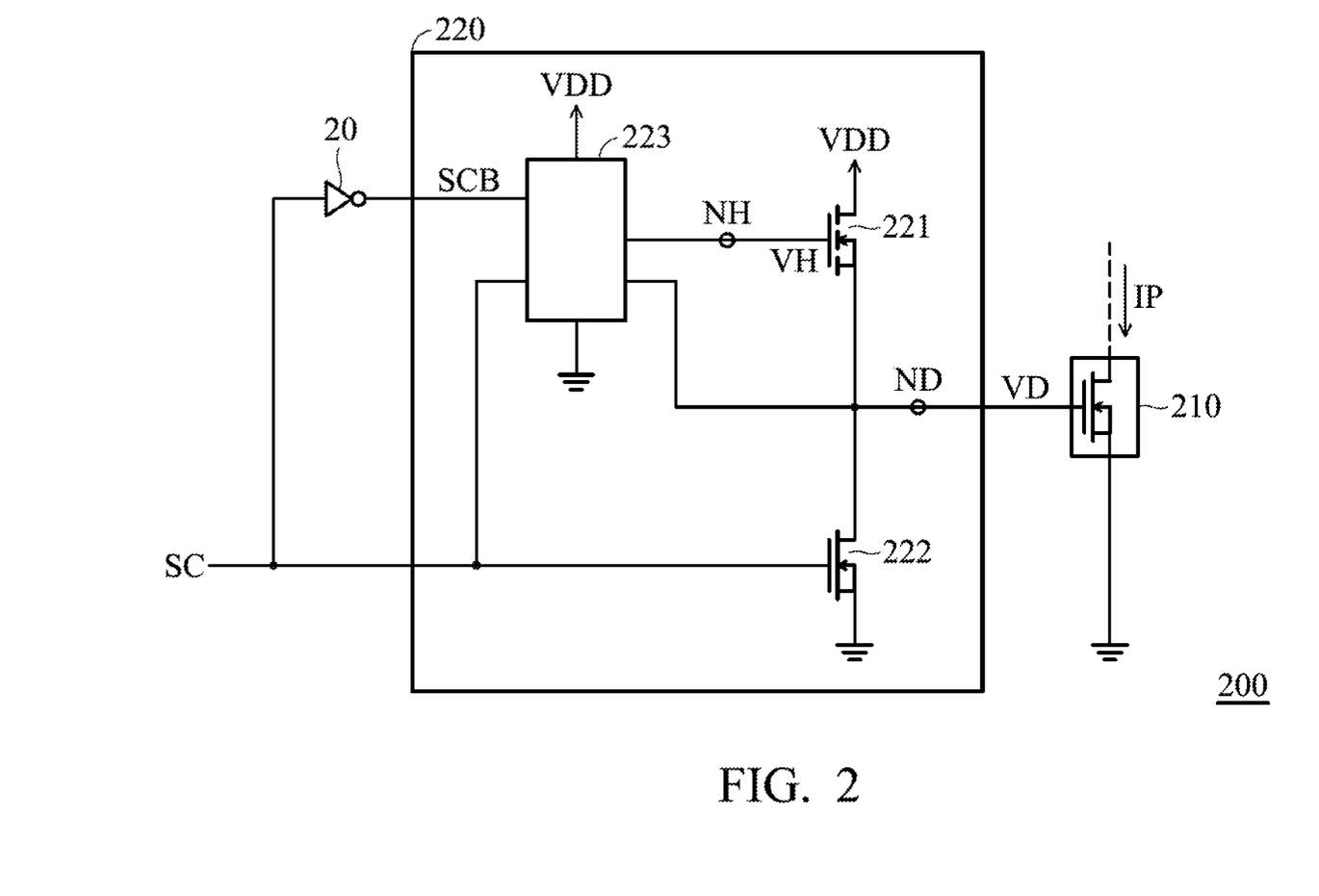
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 210 and a first bootstrap circuit 220. The power transistor 210 sinks the power current IP to the ground according to the driving voltage VD of the driving node ND. According to an embodiment of the invention, the power transistor 210 is a GaN transistor.

The first bootstrap circuit 220 and the inverter 20 act as a driving circuit for driving the power transistor 210. The first bootstrap circuit 220 includes a high-side transistor 221, a low-side transistor 222, and a charge pump 223. The high-side transistor 221 supplies the supply voltage VDD to the driving node ND according to the high-side voltage VH of the high-side node NH. The low-side transistor 222 is coupled between the driving node ND and the ground, and configured to pull the driving voltage VD down to the ground according to the control signal SC. According to an embodiment of the invention, the high-side transistor 221 and the low-side transistor 222 are normally-off transistors.

The charge pump 223 is supplied by the supply voltage VDD and the ground and coupled to the high-side node NH and the driving node ND. To fully turn on the high-side transistor 221, the charge pump 223 is configured to generate a high-side voltage VH that exceeds the supply voltage VDD according to the control signal SC and the reverse control signal SCB generated by the inverter 20, such that the gate-to-source voltage of the high-side transistor 221 at least exceeds the threshold voltage to apply the supply voltage VDD to the driving node ND. According to an embodiment of the invention, the first bootstrap circuit 220 is a rail-to-rail driver, such that the driving voltage VD ranges from the supply voltage VDD to the ground level.

Figure 3:
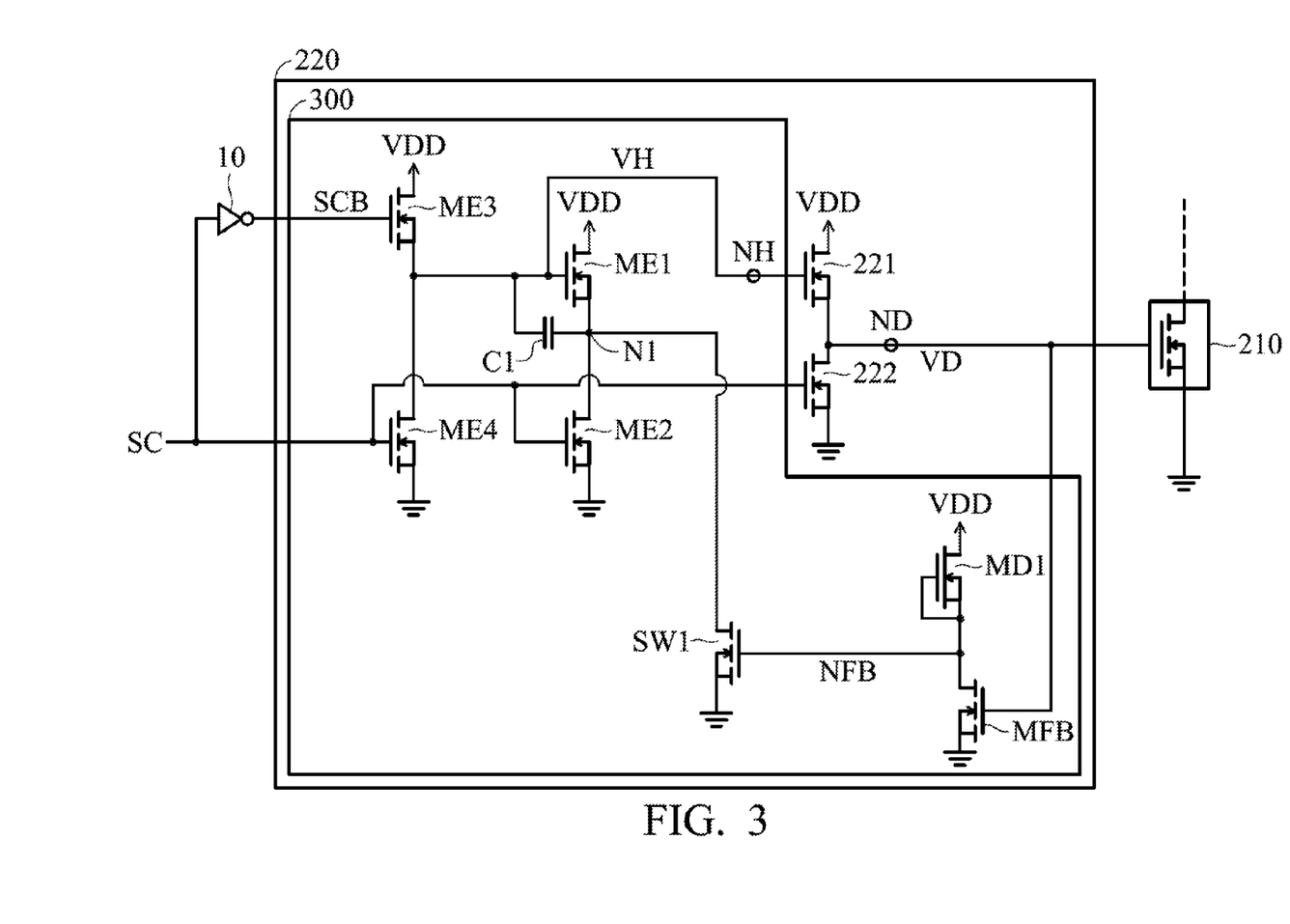
FIG. 3 shows a schematic diagram of the charge pump 223 in FIG. 2 in accordance with the invention.

FIG. 3 shows a schematic diagram of the charge pump 223 in FIG. 2 in accordance with the invention. As shown in FIG. 3, the charge pump 300, which is coupled to the driving node ND and the high-side node NH and receives the control signal SC and the reverse control signal SCB, includes a first normally-on transistor MD1, a feedback normally-off transistor MFB, a first switch SW1, a first normally-off transistor ME1, a second normally-off transistor ME2, a first capacitor C1, a third normally-off transistor ME3, and a fourth normally-off transistor ME4.

The source terminal and the gate terminal of the first normally-on transistor MD1 are coupled to a feedback node NFB and the drain terminal of the first normally-on transistor MD1 is supplied by the supply voltage VDD. The source terminal of the feedback normally-off transistor MFB is coupled to the ground, the gate terminal of the feedback normally-off transistor MFB is coupled to the driving node ND, and the drain terminal of the feedback normally-off transistor MFB is coupled to the feedback node NFB.

The first switch SW1 is configured to electrically connect the first node N1 to the ground according to a voltage of the feedback node NFB. The source terminal of the first normally-off transistor ME is coupled to the first node N1, the gate terminal of the first normally-off transistor ME1 is coupled to the high-side node NH, and the drain terminal of the first normally-off transistor ME1 is supplied by the supply voltage VDD.

The source terminal of the second normally-off transistor ME2 is coupled to the ground, the gate terminal of the second normally-off transistor ME2 receives the control signal SC, and the drain terminal of the second normally-off transistor ME2 is coupled to the first node N1.

The first capacitor C1 is coupled between the first node N1 and the high-side node NH. The source terminal of the third normally-off transistor ME3 is coupled to the high-side node NH, the gate terminal of the third normally-off transistor ME3 receives the reverse control signal SCB, and the drain terminal of the third normally-off transistor ME3 is supplied by the supply voltage VDD.

The source terminal of the fourth normally-off transistor ME4 is coupled to the ground, the gate terminal of the fourth normally-off transistor ME4 receives the control signal SC, and the drain terminal of the fourth normally-off transistor ME4 is coupled to the high-side node NH.

According to an embodiment of the invention, when the control signal SC is at the low voltage level, the reverse control signal SCB is at the high voltage level, and the driving voltage VD is still at the low voltage level, the voltage of the feedback node NFB is raised by the first normally-on transistor MD1 to turn ON the first switch SW1, so that the first capacitor C1 is charged by the supply voltage VDD through the third normally-off transistor ME3 and the first switch SW1.

With the high-side voltage VH ramping up, the first normally-off transistor ME1 is gradually turned ON so that the first node N1 ramps up accordingly to boost the high-side voltage VH through the first capacitor C1 for fully turning ON the high-side transistor 221 and the first normally-off transistor ME1, such that the voltage of the first node N1 and the driving voltage VD eventually reach the supply voltage VDD.

When the driving voltage VD is high enough to turn ON the feedback normally-off transistor MFB, the first switch SW1 is turned OFF, such that the voltage of the first node N1 is raised to the supply voltage VDD by the first normally-off transistor ME1. Accordingly, the high-side voltage VH, which is equal to the sum of the voltage of the first node N1 and the voltage across the first capacitor C1, is boosted to a voltage higher than the supply voltage VDD after the first switch SW1 is turned OFF.

According to an embodiment of the invention, since the first capacitor C1 is not charged through the low-side transistor 222, the parasitic effects may not interfere with the high-side voltage VH.

Figure 4:
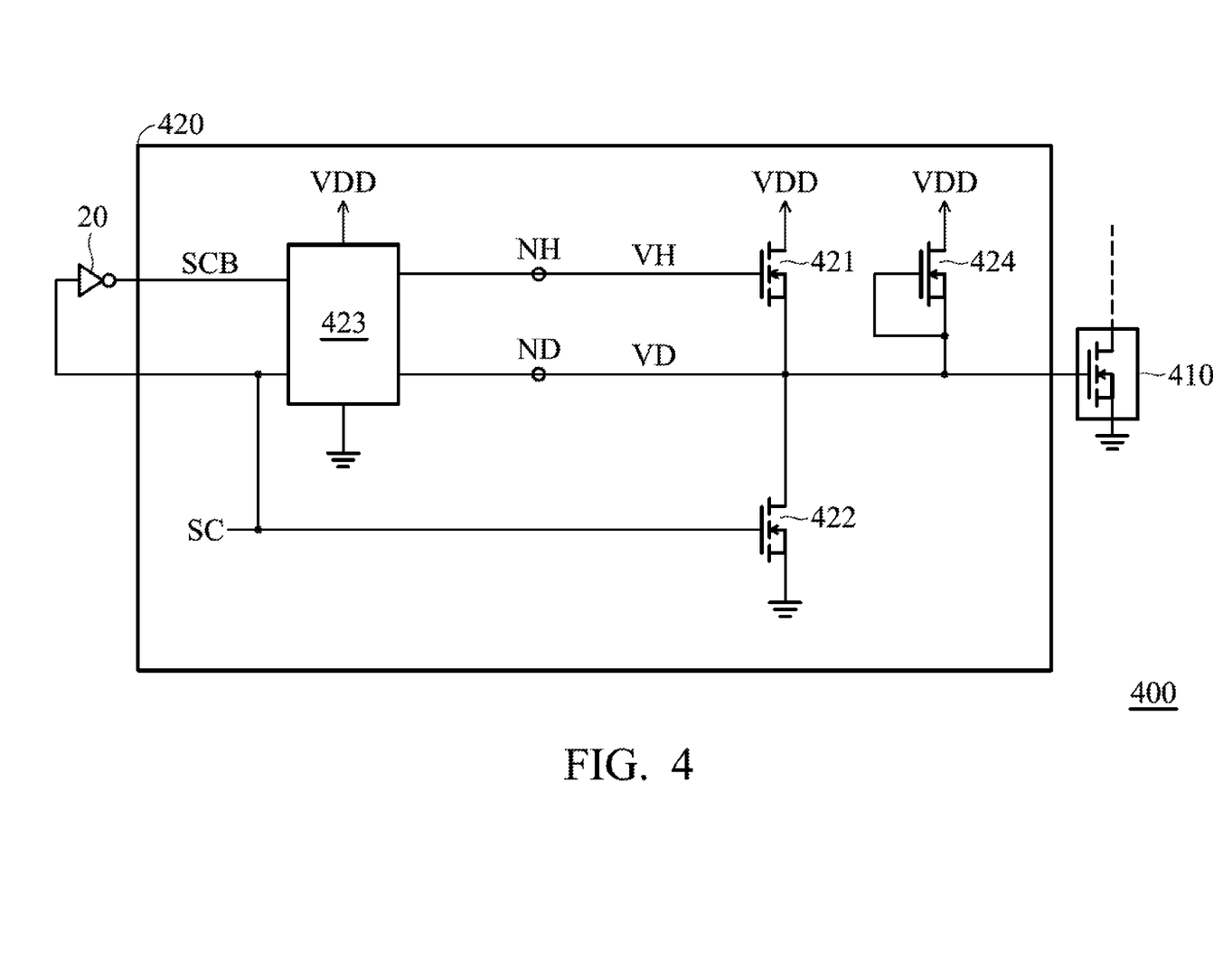
FIG. 4 shows a block diagram of a power circuit in accordance with another embodiment of the invention.

FIG. 4 shows a block diagram of a power circuit in accordance with another embodiment of the invention. As shown in FIG. 4, the power circuit 400 includes a power transistor 410 and a first bootstrap circuit 420, in which the power transistor 410 and the first bootstrap circuit 420 respectively correspond to the power transistor 210 and the first bootstrap circuit 220 in FIG. 2.

The first bootstrap circuit 420 and the inverter 20 act as a driving circuit for driving the power transistor 410. The first bootstrap circuit 420 includes a high-side transistor 421, a low-side transistor 422, and a charge pump 423 which respectively correspond to the high-side transistor 221, the low-side transistor 222, and the charge pump 223 in FIG. 2, and further includes a high-side normally-on transistor 424. The source terminal and the gate terminal of the high-side normally-on transistor 424 are coupled to the driving node ND, and the drain terminal of the high-side normally-on transistor 424 is supplied by the supply voltage VDD. The high-side normally-on transistor 424 is always turned ON to improve the driving capability of the high-side transistor 421.

Figure 5:
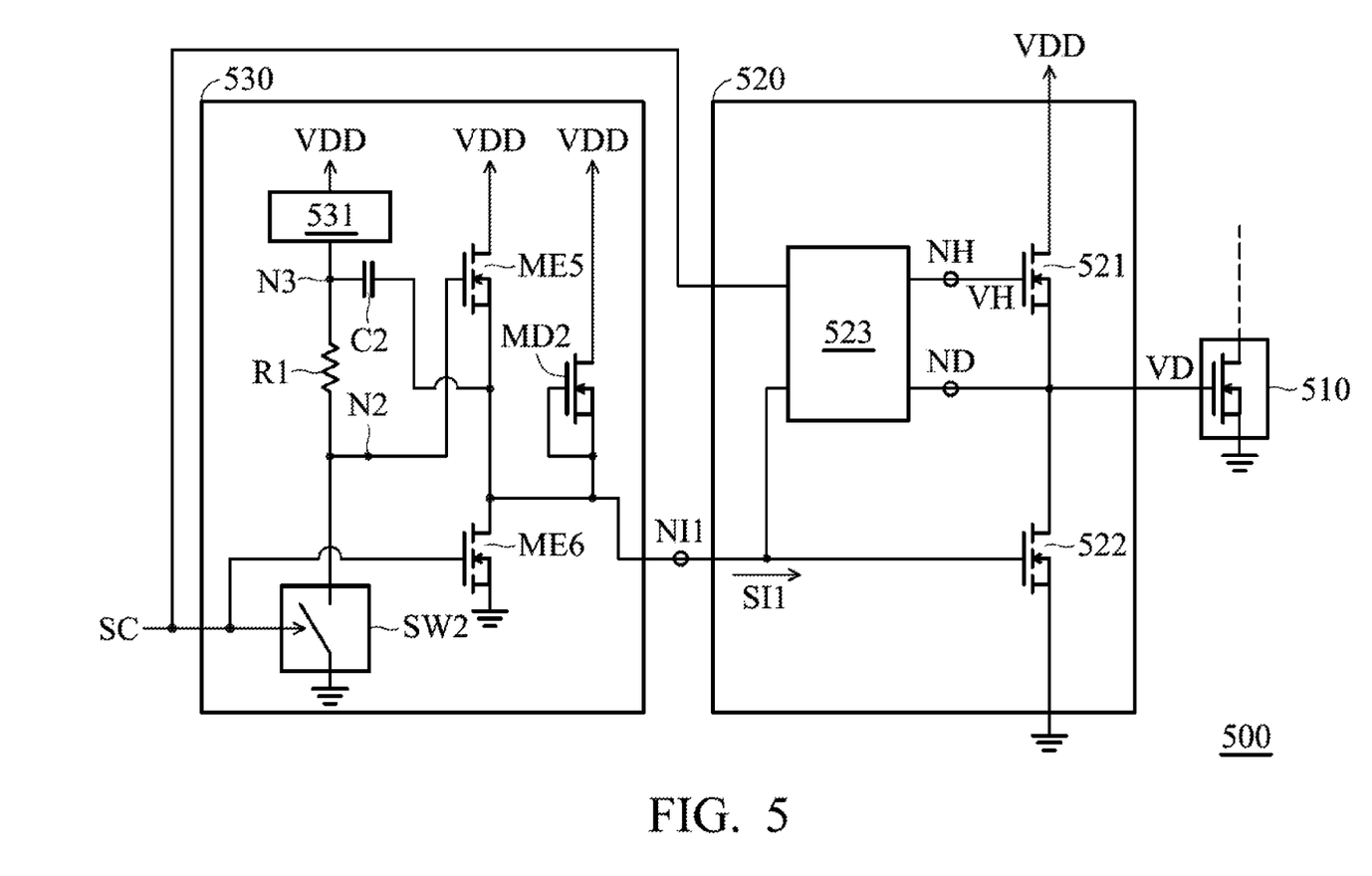
FIG. 5 shows a block diagram of a power circuit in accordance with yet another embodiment of the invention.

FIG. 5 shows a block diagram of a power circuit in accordance with yet another embodiment of the invention. As shown in FIG. 5, the power circuit 500 includes a power transistor 510, a first bootstrap circuit 520, and a second bootstrap circuit 530, in which the power transistor 510 corresponds to the power transistor 210 in FIG. 2.

The first bootstrap circuit 520 and the second bootstrap circuit 530 act as a driving circuit for driving the power transistor 510. The first bootstrap circuit 520 includes a high-side transistor 521, a low-side transistor 522, and a charge pump 523, in which the charge pump 523 receives the control signal SC and the first internal signal SI1 since the first internal signal SI1 acts as an inverse of the control signal SC.

The second bootstrap circuit 530 includes a fifth normally-off transistor ME5, a sixth normally-off transistor ME6, a second capacitor C2, a first unidirectional conducting device 531, a first resistor R1, and a second switch SW2.

The source terminal of the fifth normally-off transistor ME5 is coupled to the first internal node NI1, the gate terminal of the fifth normally-off transistor ME5 is coupled to a second node N2, and the drain terminal of the fifth normally-off transistor ME5 is supplied by the supply voltage VDD. The source terminal of the sixth normally-off transistor ME6 is coupled to the ground, the gate terminal of the sixth normally-off transistor ME6 receives the control signal SC, and the drain terminal is coupled to the first internal node NI1.

The second capacitor C2 is coupled between the third node N3 and the first internal node NI1. The first unidirectional conducting device 531 unidirectionally provides the supply voltage VDD to the third node N3. According to an embodiment of the invention, the first unidirectional conducting device 531 is a diode. According to another embodiment of the invention, the first unidirectional conducting device 531 is a diode-connected normally-off transistor.

The first resistor R1 is coupled between the second node N2 and the third node N3. The second switch SW2 is configured to electrically connect the second node N2 to the ground according to the control signal SC. For the simplicity of illustration, the second switch SW2 is illustrated herein as an N-type transistor. According to an embodiment of the invention, when the control signal SC is at the high voltage level, the sixth normally-off transistor ME6 and the second switch SW2 are turned ON, such that the first internal node NI1 and the second node N2 are both coupled to the ground.

According to an embodiment of the invention, when the control signal SC is at the high voltage level, the second capacitor C2 is charged by the supply voltage VDD through the first unidirectional conducting device 531 and the sixth normally-off transistor ME6, and the supply voltage VDD is applied to the gate terminal of the fifth normally-off transistor ME5 through the first unidirectional conducting device 531 and the first resistor R1.

When the fifth normally-off transistor ME5 is gradually turned ON, the first internal signal SI1 is pulled high such that the voltage of the third node N3 (i.e., the gate terminal of the fifth normally-off transistor ME5) is boosted to a voltage equal to the sum of the voltage across the second capacitor C2 and the first internal signal SI1. The voltage of the third node N3 is then provided for the second node N2 (i.e., the gate terminal of the fifth normally-off transistor ME5) through the first resistor R1, resulting in fully turning ON the fifth normally-off transistor ME5 and making the first internal signal SI1 equal to the supply voltage VDD.

According to an embodiment of the invention, the second bootstrap circuit 530 may further include a second normally-on transistor MD2, which is always turned ON, for improving the driving capability of the fifth normally-off transistor ME5. The source terminal and the gate terminal of the second normally-on transistor MD2 are coupled to the first internal node NI1, and the drain terminal of the second normally-on transistor MD2 is supplied by the supply voltage VDD.

According to an embodiment of the invention, since the first internal signal SI1 generated by the second bootstrap circuit 530 is an inverse of the control signal SC, the function of inverter 20 in FIGS. 2 and 4, which is configured to generate an inverse of the control signal SC, may be taken over by the second bootstrap circuit 530.

Figure 6:
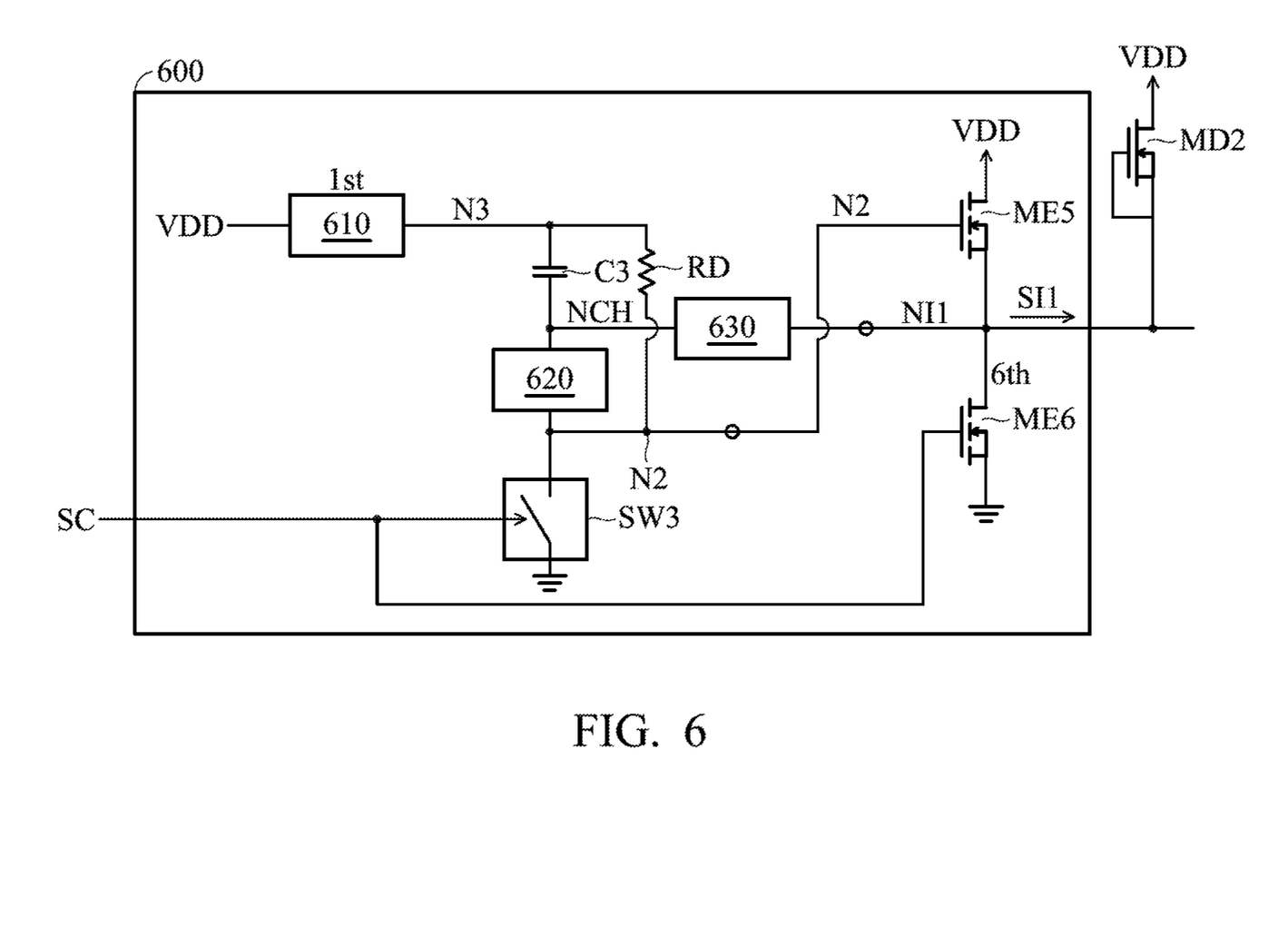
FIG. 6 shows a schematic diagram of a power circuit in accordance with another embodiment of the invention.

FIG. 6 shows a schematic diagram of a power circuit in accordance with another embodiment of the invention. According to an embodiment of the invention, the second bootstrap circuit 530 in FIG. 5 may be replaced with the bootstrap circuit 600 in FIG. 6. As shown in FIG. 6, the bootstrap circuit 600 includes a fifth normally-off transistor ME5, a sixth normally-off transistor ME6, a second unidirectional conducting device 610, a third unidirectional conducting device 620, a fourth unidirectional conducting device 630, a third capacitor C3, a discharge resistor RD, and a third switch SW3.

The fifth normally-off transistor ME5 and the sixth normally-off transistor ME6 are the same as the fifth normally-off transistor ME5 and the sixth normally-off transistor ME6 in FIG. 5. The second unidirectional conducting device 610 unidirectionally provides the supply voltage VDD to a third node N3. When the supply voltage VDD exceeds the voltage of the third node N3, the second unidirectional conducting device 610 is turned ON. When the supply voltage VDD does not exceed the voltage of the third node N3, the second unidirectional conducting device 610 is turned OFF.

The third capacitor C3 is coupled between the third node N3 and a charge node NCH. The discharge resistor RD is coupled between the second node N2 and the third node N3. The third unidirectional conducting device 620 is coupled between the charge node NCH and the second node N2. When the voltage of the charge node NCH exceeds the voltage of the second node N2, the third unidirectional conducting device 620 unidirectionally electrically connects the charge node NCH to the second node N2.

The fourth unidirectional conducting device 630 is coupled between the first internal node NI1 and the charge node NCH. When the first internal signal SI1 exceeds the voltage of the charge node NCH, the fourth unidirectional conducting device 630 is turned ON. When the first internal signal SI1 does not exceed the voltage of the charge node NCH, the fourth unidirectional conducting device 630 is turned OFF.

The third switch SW3 receives the control signal SC and is coupled between the second node N2 and the ground. In addition, the third switch SW3 is configured to couple the second node N2 to the ground according to the control signal SC.

For the simplicity of illustration, the third switch SW3 is illustrated herein as an N-type transistor. According to an embodiment of the invention, when the control signal SC is at the high voltage level, such as the supply voltage VDD, the third switch SW3 is turned ON and the third capacitor C3 is charged by the supply voltage VDD through the second unidirectional conducting device 610, the third unidirectional conducting device 620, and the third switch SW3 to the ground.

According to another embodiment of the invention, when the control signal SC is at the low voltage level, such as the ground level, the third switch SW3 is turned OFF and the fourth unidirectional conducting device 630 provides the first internal signal SI1 to the charge node NCH, such that the third capacitor C3 is discharged to the second node N2 (i.e., the gate terminal of the fifth normally-off transistor ME5) through the discharge resistor RD.

According to an embodiment of the invention, the resistance of the discharge resistor RD determines the maximum voltage to which the third capacitor C3 can be charged and also the maximum voltage that the voltage of the second node N2 can reach. In addition, the greater the resistance that the discharge resistor RD has, the lower the rising speed of the high-side voltage VD that can be achieved. Therefore, there is a trade-off on the resistance of the discharge resistor RD.

According to an embodiment of the invention, each of the second unidirectional conducting device 610, the third unidirectional conducting device 620, and the fourth unidirectional conducting device 630 is a diode. According to another embodiment of the invention, each of the second unidirectional conducting device 610, the third unidirectional conducting device 620, and the fourth unidirectional conducting device 630 is a diode-connected normally-off transistor.

According to an embodiment of the invention, the bootstrap circuit 600 may further include a second normally-on transistor MD2, which is always turned ON, for improving the driving capability of the fifth normally-off transistor ME5. The source terminal and the gate terminal of the second normally-on transistor MD2 are coupled to the first internal node NI1, and the drain terminal of the second normally-on transistor MD2 is supplied by the supply voltage VDD.

Figure 7:
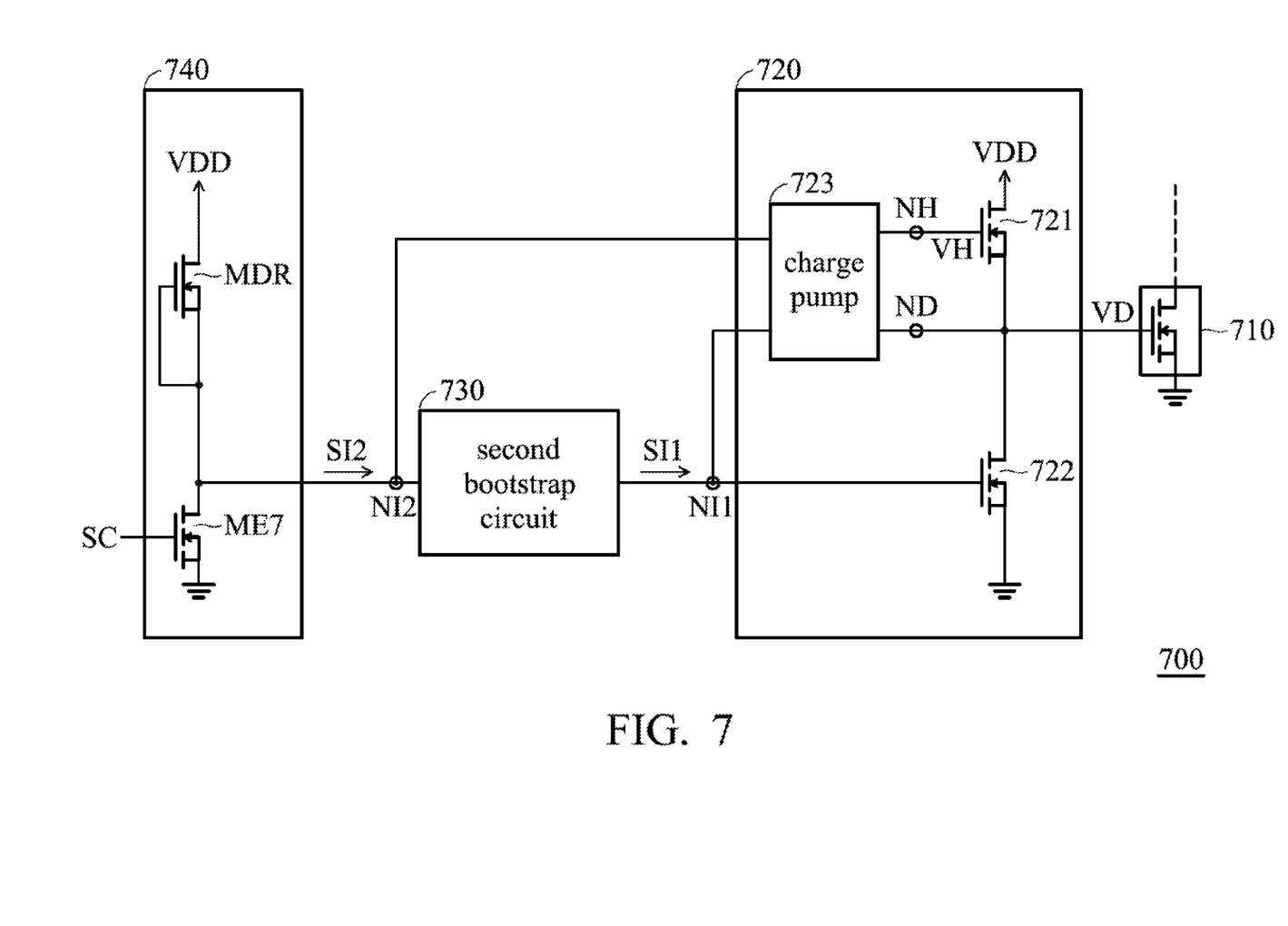
FIG. 7 shows a block diagram of a power circuit in accordance with yet another embodiment of the invention.

FIG. 7 shows a block diagram of a power circuit in accordance with yet another embodiment of the invention. As shown in FIG. 7, the power circuit 700 includes a power transistor 710, a first bootstrap circuit 720, a second bootstrap circuit 730, and a pre-driver 740, in which the first bootstrap circuit 720 includes a high-side transistor 721, a low-side transistor 722, and a charge pump 723. The first bootstrap circuit 720, the second bootstrap circuit 730, and the pre-driver 740 act as a driving circuit for driving the power transistor 710.

The power transistor 710, the high-side transistor 721, the low-side transistor 722, and the charge pump 723 respectively correspond to the power transistor 210, the high-side transistor 221, the low-side transistor 222, and the charge pump 223 in FIG. 2. The second bootstrap circuit 730 corresponds to either the second bootstrap circuit 530 in FIG. 5 or the second bootstrap circuit 600 in FIG. 6. According to an embodiment of the invention, the high-side normally-on transistor 424 in FIG. 4 may also be employed for improving the driving capability of the high-side transistor 721.

The first bootstrap circuit 720, the second bootstrap circuit 730, and the pre-driver 740 act as a driving circuit for driving the power transistor 710. The pre-driver 740 receives the control signal SC to generate the second internal signal SI2 to the second bootstrap 730 for improving the driving capability of the control signal SC. The pre-driver 740 includes a driving normally-on transistor MDR and a seventh normally-off transistor ME7.

The gate terminal and the source terminal of the driving normally-on transistor MDR are coupled to the second internal node NI2, and the drain terminal of the driving normally-on transistor MDR is supplied by the supply voltage VDD. The gate terminal of the seventh normally-off transistor ME7 receives the control signal SC, the source terminal of the seventh normally-off transistor ME7 is coupled to the ground, and the drain terminal of the seventh normally-off transistor ME7 is coupled to the second internal node NI2.

Figure 8:
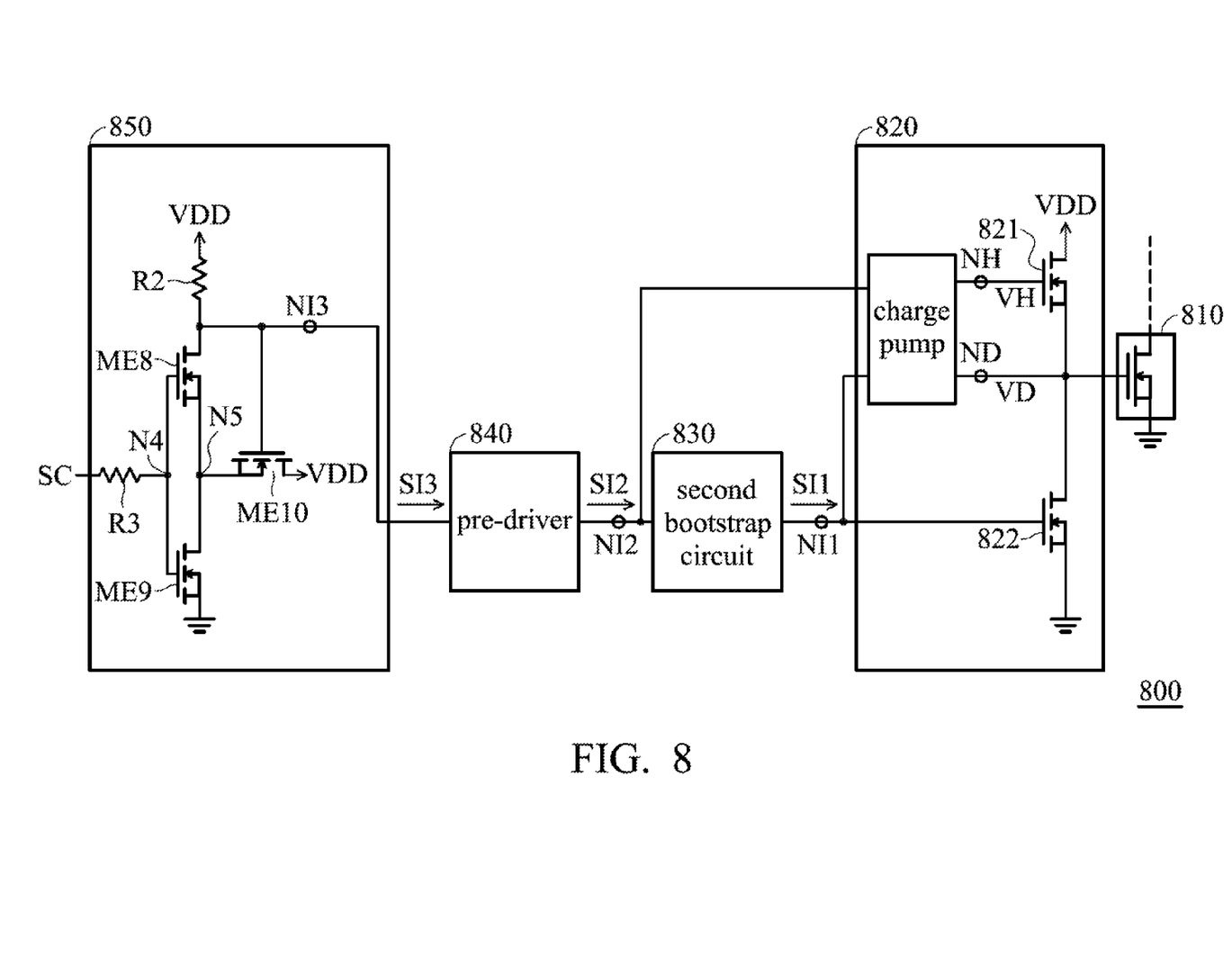
FIG. 8 shows a block diagram of a power circuit in accordance with yet another embodiment of the invention.

FIG. 8 shows a block diagram of a power circuit in accordance with yet another embodiment of the invention. As shown in FIG. 7, the power circuit 800 includes a power transistor 810, a first bootstrap circuit 820, a second bootstrap 830, a pre-driver 840, and a hysteresis circuit 850, in which the first bootstrap circuit 820 includes a high-side transistor 821, a low-side transistor 822, and a charge pump 823. The first bootstrap circuit 820, the second bootstrap circuit 830, the pre-driver 840 and the hysteresis circuit 850 act as a driving circuit for driving the power transistor 810.

The power transistor 810, the high-side transistor 821, the low-side transistor 822, the charge pump 823, the second bootstrap 830, and the pre-driver 840 respectively correspond to the power transistor 710, the high-side transistor 721, the low-side transistor 722, the charge pump 723, the second bootstrap 730, and the pre-driver 740 in FIG. 7. The second bootstrap circuit 830 corresponds to either the second bootstrap circuit 530 in FIG. 5 or the second bootstrap circuit 600 in FIG. 6. According to an embodiment of the invention, the high-side normally-on transistor 424 in FIG. 4 may also be employed for improving the driving capability of the high-side transistor 821.

The hysteresis circuit 850 receives the control signal SC to generate the third internal signal SI3 at the third internal node NI3 to the pre-driver 840 for further providing a hysteresis for the control signal SC. The hysteresis circuit 850 includes a second resistor R2, an eighth normally-off transistor ME8, a ninth normally-off transistor ME9, a tenth normally-off transistor ME10, and a third resistor R3.

The second resistor R2 is coupled between the supply voltage VDD and the third internal node NI3. The gate terminal of the eighth normally-off transistor ME8 is coupled to a fourth node N4, the source terminal of the eighth normally-off transistor ME8 is coupled to the fifth node N5, and the drain terminal of the eighth normally-off transistor ME8 is coupled to the second resistor R2 at the third internal node NI3. The gate terminal of the ninth normally-off transistor ME9 is coupled to the fourth node N4, the source terminal of the ninth normally-off transistor ME9 is coupled to the ground, and the drain terminal of the ninth normally-off transistor ME9 is coupled to the fifth node N5.

The gate terminal of the tenth normally-off transistor ME10 is coupled to the third internal node N3, the source terminal of the tenth normally-off transistor ME10 is coupled to the fifth node N5, and the drain terminal of the tenth normally-off transistor ME10 is supplied by the supply voltage VDD. The third resistor R3 is coupled to the fourth node N4 and receives the control signal SC.

Since the first capacitor C1 of the charge pump 300 is not charged through the power transistor 210 as shown in FIG. 3, the high-side voltage VH can be kept steady and protected from interference. The second bootstrap circuit 530 in FIG. 5, the second bootstrap circuit 630 in FIG. 6, the pre-driver 740 in FIG. 7, and the hysteresis circuit 850 in FIG. 8 are configured to improve the driving capability of the control signal SC.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A power circuit, comprising:
   a power transistor, sinking a power current to a ground according to a driving voltage of a driving node; and
   a driving circuit, comprising:
      a first bootstrap circuit, comprising:
         a high-side transistor, providing a supply voltage to the driving node according to a high-side voltage of a high-side node;
         a low-side transistor, electrically connecting the driving node to the ground according to a first internal signal; and a charge pump, coupled to the high-side node and the driving node, wherein the charge pump is configured to generate the high-side voltage that exceeds the supply voltage according to the first internal signal and a second internal signal;

a second bootstrap circuit, receiving the second internal signal to generate the first internal signal at a first internal node;

a pre-driver, receiving a third internal signal to generate the second internal signal at a second internal node, wherein the second bootstrap circuit and the pre-driver are configured to improve driving capability of the control signal; and a hysteresis circuit, receiving a control signal to generate the third internal signal at a third internal node and configured to provide a hysteresis for the control signal.

2. The power circuit of claim 1, wherein the high-side transistor and the low-side transistor are normally-off transistors.

3. The power circuit of claim 1, wherein the power transistor is a GaN transistor.

4. The power circuit of claim 1, wherein the charge pump comprises:

a first normally-on transistor, comprising a source terminal, a gate terminal, and a drain terminal, wherein the source terminal and the gate terminal are coupled to a feedback node, and the drain terminal is supplied by the supply voltage;

a feedback normally-off transistor, comprising a source terminal, a gate terminal, and a drain terminal, wherein the source terminal is coupled to the ground, the gate terminal is coupled to the driving node, and the drain terminal is coupled to the feedback node;

a first switch, configured to electrically connect a first node to the ground according to a voltage of the feedback node;

a first normally-off transistor, comprising a source terminal, a gate terminal, and a drain terminal, wherein the source terminal is coupled to the first node, the gate terminal is coupled to the high-side node, and the drain terminal is supplied by the supply voltage;

a second normally-off transistor, comprising a source terminal, a gate terminal, and a drain terminal, wherein the source terminal is coupled to the ground, the gate terminal receives the first internal signal, and the drain terminal is coupled to the first node;

a first capacitor, coupled between the first node and the high-side node;

a third normally-off transistor, comprising a source terminal, a gate terminal, and a drain terminal, wherein the source terminal is coupled to the high-side node, the gate terminal receives the second internal signal, and the drain terminal is supplied by the supply voltage; and a fourth normally-off transistor, comprising a source terminal, a gate terminal, and a drain terminal, wherein the source terminal is coupled to the ground, the gate terminal receives the first internal signal, and the drain terminal is coupled to the high-side node.

5. The power circuit of claim 4, wherein when the second internal signal is at a high voltage level, the first internal signal is at a low voltage level, and the driving voltage is at the low voltage level, the voltage of the feedback node is raised by the first normally-on transistor to turn ON the first switch, so that the first capacitor is charged by the supply voltage through the third normally-off transistor and the first switch and the first node is charged by the first normally-off transistor, wherein when the high-side voltage is raised to turn ON the first normally-off transistor, a voltage of the first node is raised to boost the high-side voltage for fully turning ON the high-side transistor, wherein when the driving voltage is raised to turn ON the feedback normally-off transistor, the first switch is turned OFF, such that the voltage of the first node is raised to the supply voltage.

6. The power circuit of claim 1, wherein the second bootstrap circuit comprises:

a fifth normally-off transistor, comprising a source terminal, a gate terminal, and a drain terminal, wherein the source terminal is coupled to the first internal node, the gate terminal is coupled to a second node, and the drain terminal is supplied by the supply voltage;

a sixth normally-off transistor, comprising a source terminal, a gate terminal, and a drain terminal, wherein the source terminal is coupled to the ground, the gate terminal receives the second internal signal, and the drain terminal is coupled to the first internal node;

a second capacitor, coupled between a third node and the first internal node;

a first unidirectional conducting device, unidirectionally providing the supply voltage to the third node;

a first resistor, coupled between the second node and the third node; and a second switch, configured to electrically connect the second node to the ground according to the second internal signal.

7. The power circuit of claim 6, wherein when the second internal signal is at a high voltage level, the sixth normally-off transistor and the second switch are turned ON and the second capacitor is charged by the supply voltage through the first unidirectional conducting device and the sixth normally-off transistor, wherein when the second internal signal is at a low voltage level, the sixth normally-off transistor and the second switch are turned OFF, the first resistor provides a voltage of the third node to the second node to turn ON the fifth normally-off transistor, wherein when the fifth normally-off transistor is turned ON to raise the first internal signal, the voltage of the third node is equal to a sum of a voltage across the second capacitor and the first internal signal for fully turning ON the fifth transistor.

8. The power circuit of claim 6, wherein the second bootstrap circuit further comprises:

a second normally-on transistor, comprising a source terminal, a gate terminal, and a drain terminal, wherein the source terminal and the gate terminal are coupled to the first internal node and the drain terminal is supplied by the supply voltage, wherein the second normally-on transistor is configured to improve the driving capability of the fifth normally-off transistor.

9. The power circuit of claim 1, wherein the second bootstrap circuit comprises:

a fifth normally-off transistor, comprising a source terminal, a gate terminal, and a drain terminal, wherein the source terminal is coupled to the first internal node, the gate terminal is coupled to a second node, and the drain terminal is supplied by the supply voltage; and a sixth normally-off transistor, comprising a source terminal a gate terminal, and a drain terminal, wherein the source terminal is coupled to the ground, the gate terminal receives the second internal signal, and the drain terminal is coupled to the first internal node;

a second unidirectional conducting device, unidirectionally providing the supply voltage to a third node;

a third capacitor, coupled between the third node and a charge node;

a discharge resistor, coupled between the second node and the third node;

a third unidirectional conducting device, unidirectionally electrically connecting the charge node to the second node when a voltage of the charge node exceeds a voltage of the second node;

a fourth unidirectional conducting device, unidirectionally providing the first internal signal to the charge node when the first internal signal exceeds a voltage of the charge node; and a third switch, receiving the control signal and configured to couple the high-side node to the ground according to the control signal.

10. The power circuit of claim 9, wherein each of the second unidirectional conducting device, the third unidirectional conducting device, and the fourth unidirectional conducting device is a diode or a diode-connected normally-off transistor.

11. The power circuit of claim 9, wherein when the second internal signal is at a high voltage level, the third switch is turned ON and the third capacitor is charged by the supply voltage through the second unidirectional conducting device, the third unidirectional conducting device, and the third switch, wherein when the second internal signal is at a low voltage level, the third switch is turned OFF, the fourth unidirectional conducting device provides the first internal signal to the charge node, and the third capacitor is discharged to the second node through the discharge resistor.

12. The power circuit of claim 9, wherein the second bootstrap circuit further comprises:

a second normally-on transistor, comprising a source terminal, a gate terminal, and a drain terminal, wherein the source terminal and the gate terminal are coupled to the first internal node and the drain terminal is supplied by the supply voltage, wherein the second normally-on transistor is configured to improve the driving capability of the fifth normally-off transistor.

13. The power circuit of claim 1, wherein the first bootstrap circuit further comprises:

a high-side normally-on transistor, comprising a source terminal coupled to the driving node, a gate terminal coupled to the driving node, and a drain terminal supplied by the supply voltage, wherein the high-side normally-on transistor is configured to improve the driving capability of the high-side transistor.

14. The power circuit of claim 1, wherein the pre-driver comprises:

a driving normally-on transistor, comprising a source terminal, a gate terminal, and a drain terminal, wherein the gate terminal and the source terminal are coupled to the second internal node and the drain terminal is supplied by the supply voltage; and a seventh normally-off transistor, comprising a source terminal, a gate terminal, and a drain terminal, wherein the gate terminal receives the third internal signal, a source terminal is coupled to the ground, and the drain terminal is coupled to the second internal node.

15. The power circuit of claim 1, wherein the hysteresis circuit comprises:

a second resistor, coupled between the supply voltage and the third internal node;

an eighth normally-off transistor, comprising a gate terminal coupled to a fourth node, a source terminal coupled to a fifth node, and a drain terminal coupled to the second resistor;

a ninth normally-off transistor, comprising a gate terminal coupled to the fourth node, a source terminal coupled to the ground, and a drain terminal coupled to the fifth node;

a tenth normally-off transistor, comprising a gate terminal coupled to the drain terminal of the eighth normally-off transistor, a source terminal coupled to the fifth node, and a drain terminal supplied by the supply voltage; and a third resistor, providing the control signal to the fourth node.

16. A driving circuit for driving a power transistor, wherein the power transistor sinks a power current to a ground according to a driving voltage of a driving node, the driving circuit comprising:

a first bootstrap circuit, comprising:

a high-side transistor, providing a supply voltage to the driving node according to a high-side voltage of a high-side node;

a low-side transistor, electrically connecting the driving node to the ground according to a first internal signal; and a charge pump, coupled to the high-side node and the driving node, wherein the charge pump is configured to generate a high-side voltage that exceeds the supply voltage according to the first internal signal;

a second bootstrap circuit, receiving the second internal signal to generate the first internal signal at a first internal node;

a pre-driver, receiving a third internal signal to generate the second internal signal at a second internal node, wherein the second bootstrap circuit and the pre-driver are configured to improve the driving capability of the control signal; and a hysteresis circuit, receiving a control signal to generate the third internal signal and configured to provide a hysteresis for the control signal.

17. The driving circuit of claim 16, wherein the high-side transistor and the low-side transistor are normally-off transistors.

18. The driving circuit of claim 16, wherein the power transistor is a GaN transistor.

19. The driving circuit of claim 16, wherein the charge pump comprises:

a first normally-on transistor, comprising a source terminal, a gate terminal, and a drain terminal, wherein the source terminal and the gate terminal are coupled to a feedback node, and the drain terminal is supplied by the supply voltage;

a feedback normally-off transistor, comprising a source terminal, a gate terminal, and a drain terminal, wherein the source terminal is coupled to the ground, the gate terminal is coupled to the driving node, and the drain terminal is coupled to the feedback node;

a first switch, configured to electrically connect a first node to the ground according to a voltage of the feedback node;

a first normally-off transistor, comprising a source terminal, a gate terminal, and a drain terminal, wherein the source terminal is coupled to the first node, the gate terminal is coupled to the high-side node, and the drain terminal is supplied by the supply voltage;

a second normally-off transistor, comprising a source terminal, a gate terminal, and a drain terminal, wherein the source terminal is coupled to the ground, the gate terminal receives the first internal signal, and the drain terminal is coupled to the first node;

a first capacitor, coupled between the first node and the high-side node;

a third normally-off transistor, comprising a source terminal a gate terminal, and a drain terminal, wherein the source terminal is coupled to the high-side node, the gate terminal receives the second internal signal, and the drain terminal is supplied by the supply voltage; and a fourth normally-off transistor, comprising a source terminal a gate terminal, and a drain terminal, wherein the source terminal is coupled to the ground, the gate terminal receives the first internal signal, and the drain terminal is coupled to the high-side node.

20. The driving circuit of claim 19, wherein when the second internal signal is at a high voltage level, the first internal signal is at a low voltage level, and the driving voltage is at the low voltage level, the voltage of the feedback node is raised by the first normally-on transistor to turn ON the first switch, so that the first capacitor is charged by the supply voltage through the third normally-off transistor and the first switch and the first node is charged by the first normally-off transistor, wherein when the high-side voltage is raised to turn ON the first normally-off transistor, a voltage of the first node is raised to boost the high-side voltage for fully turning ON the high-side transistor, wherein when the driving voltage is raised to turn ON the feedback normally-off transistor, the first switch is turned OFF, such that the voltage of the first node is raised to the supply voltage.

21. The driving circuit of claim 17, wherein the second bootstrap circuit comprises:
a fifth normally-off transistor, comprising a source terminal, a gate terminal, and a drain terminal, wherein the source terminal is coupled to the first internal node, the gate terminal is coupled to a second node, and the drain terminal is supplied by the supply voltage;
a sixth normally-off transistor, comprising a source terminal, a gate terminal, and a drain terminal, wherein the source terminal is coupled to the ground, the gate terminal receives the second internal signal, and the drain terminal is coupled to the first internal node;
a second capacitor, coupled between a third node and the first internal node;
a first unidirectional conducting device, unidirectionally providing the supply voltage to the third node;
a first resistor, coupled between the second node and the third node; and
a second switch, configured to electrically connect the second node to the ground according to the second internal signal.

22. The driving circuit of claim 21, wherein when the second internal signal is at a high voltage level, the sixth normally-off transistor and the second switch are turned ON and the second capacitor is charged by the supply voltage through the seventh normally-off transistor and the sixth normally-off transistor, wherein when the second internal signal is at a low voltage level, the sixth normally-off transistor and the second switch are turned OFF, the first resistor provides a voltage of the third node to the second node to turn ON the fifth normally-off transistor, wherein when the fifth normally-off transistor is turned ON to raise the first internal signal, the voltage of the third node is equal to a sum of a voltage across the second capacitor and the first internal signal for fully turning ON the fifth transistor.

23. The driving circuit of claim 21, wherein the second bootstrap circuit further comprises:

a second normally-on transistor, comprising a source terminal, a gate terminal, and a drain terminal, wherein the source terminal and the gate terminal are coupled to the first internal node and the drain terminal is supplied by the supply voltage, wherein the second normally-on transistor is configured to improve the driving capability of the fifth normally-off transistor.

24. The driving circuit of claim 16, wherein the second bootstrap circuit comprises:
a fifth normally-off transistor, comprising a source terminal, a gate terminal, and a drain terminal, wherein the source terminal is coupled to the first internal node, the gate terminal is coupled to a second node, and the drain terminal is supplied by the supply voltage; and
a sixth normally-off transistor, comprising a source terminal, a gate terminal, and a drain terminal, wherein the source terminal is coupled to the ground, the gate terminal receives the second internal signal, and the drain terminal is coupled to the first internal node;
a second unidirectional conducting device, unidirectionally providing the supply voltage to a third node;
a third capacitor, coupled between the third node and a charge node;
a discharge resistor, coupled between the second node and the third node;
a third unidirectional conducting device, unidirectionally electrically connecting the charge node to the second node when a voltage of the charge node exceeds a voltage of the second node;
a fourth unidirectional conducting device, unidirectionally providing the first internal signal to the charge node when the first internal signal exceeds a voltage of the charge node; and
a third switch, receiving the control signal and configured to couple the high-side node to the ground according to the control signal.

25. The driving circuit of claim 24, wherein each of the second unidirectional conducting device, the third unidirectional conducting device, and the fourth unidirectional conducting device is a diode or a diode-connected normally-off transistor.

26. The driving circuit of claim 24, wherein when the second internal signal is at a high voltage level, the third switch is turned ON and the third capacitor is charged by the supply voltage through the second unidirectional conducting device, the third unidirectional conducting device, and the third switch, wherein when the second internal signal is at a low voltage level, the third switch is turned OFF, the fourth unidirectional conducting device provides the first internal signal to the charge node, and the third capacitor is discharged to the second node through the discharge resistor.

27. The driving circuit of claim 24, wherein the second bootstrap circuit further comprises:
a second normally-on transistor, comprising a source terminal, a gate terminal, and a drain terminal, wherein the source terminal and the gate terminal are coupled to the first internal node and the drain terminal is supplied by the supply voltage, wherein the second normally-on transistor is configured to improve the driving capability of the fifth normally-off transistor.

28. The driving circuit of claim 16, wherein the first bootstrap circuit further comprises:
a high-side normally-on transistor, comprising a source terminal coupled to the driving node, a gate terminal coupled to the driving node, and a drain terminal supplied by the supply voltage, wherein the high-side normally-on transistor is configured to improve the driving capability of the high-side transistor.

29. The driving circuit of claim 16, wherein the pre-driver comprises:
   a driving normally-on transistor, comprising a source terminal, a gate terminal, and a drain terminal, wherein the gate terminal and the source terminal are coupled to the second internal node and the drain terminal is supplied by the supply voltage; and
   a seventh normally-off transistor, comprising a source terminal, a gate terminal, and a drain terminal, wherein the gate terminal receives the third internal signal, a source terminal is coupled to the ground, and the drain terminal is coupled to the second internal node.

30. The driving circuit of claim 16, wherein the hysteresis circuit comprises:
   a second resistor, coupled between the supply voltage and the third internal node;
   an eighth normally-off transistor, comprising a gate terminal coupled to a fourth node, a source terminal coupled to a fifth node, and a drain terminal coupled to the second resistor;
   a ninth normally-off transistor, comprising a gate terminal coupled to the fourth node, a source terminal coupled to the ground, and a drain terminal coupled to the fifth node;
   a tenth normally-off transistor, comprising a gate terminal coupled to the drain terminal of the eighth normally-off transistor, a source terminal coupled to the fifth node, and a drain terminal supplied by the supply voltage; and
   a third resistor, providing the control signal to the fourth node.

* * * * *